United States Patent
Lee

(12) United States Patent (10) Patent No.: US 6,900,520 B2
(45) Date of Patent: May 31, 2005

(54) SEMICONDUCTOR ELEMENT AND MANUFACTURING METHOD THEREOF

(75) Inventor: Suk-Kyun Lee, Incheon (KR)

(73) Assignee: Fairchild Korea Semiconductor Ltd., Kyungki-Do (KR)

( * ) Notice: Subject to any disclaimer, the term of this patent is extended or adjusted under 35 U.S.C. 154(b) by 36 days.

(21) Appl. No.: 10/045,350

(22) Filed: Nov. 9, 2001

(65) Prior Publication Data

US 2002/0063266 A1 May 30, 2002

(30) Foreign Application Priority Data

Nov. 22, 2000 (KR) ......................................... 2000-69726

(51) Int. Cl.⁷ .......................................... G01L 29/861
(52) U.S. Cl. ...................... 257/603; 257/335; 257/343; 438/301; 438/306
(58) Field of Search ................................ 257/335, 343, 257/603, 301, 197, 336, 344, 401; 438/301, 306

(56) References Cited

U.S. PATENT DOCUMENTS

| | | | | | |
|---|---|---|---|---|---|
| 4,404,576 A | * | 9/1983 | Ronen | ......................... | 257/336 |
| 4,536,945 A | * | 8/1985 | Gray et al. | .................. | 438/143 |
| 5,751,054 A | * | 5/1998 | Yilmaz et al. | ............... | 257/603 |
| 5,920,781 A | * | 7/1999 | Imoto | .......................... | 438/301 |
| 6,015,991 A | * | 1/2000 | Wheeler et al. | ............. | 257/336 |
| 6,040,593 A | * | 3/2000 | Park | ........................... | 257/292 |
| 6,252,279 B1 | * | 6/2001 | Kim | ........................... | 257/335 |
| 6,392,275 B1 | * | 5/2002 | Jang | ........................... | 357/343 |

* cited by examiner

*Primary Examiner*—David Nelms
*Assistant Examiner*—Dao H. Nguyen
(74) *Attorney, Agent, or Firm*—Marshall, Gerstein & Borun LLP

(57) ABSTRACT

A semiconductor element includes a substrate and a first DMOS element formed on a first portion of the substrate. The DMOS element includes a gate electrode that is formed to have slanted side walls. The semiconductor element also includes a first MOS element formed on a second portion of the substrate that is separate from the first portion.

7 Claims, 5 Drawing Sheets

SEMICONDUCTOR ELEMENT AND MANUFACTURING METHOD THEREOF

BACKGROUND OF THE INVENTION

1. Field of the Invention

The invention relates generally to a semiconductor element and a manufacturing method thereof. More particularly, the invention relates to a semiconductor element such as a BiCDMOS (bipolar-CMOS-DMOS) element having a bipolar transistor, a complementary metal oxide semiconductor (CMOS) transistor and a double diffused metal oxide semiconductor (DMOS) transistor formed on a single substrate.

2. Description of the Related Technology

As is well known, BiCDMOS semiconductor elements provide the low power consumption, low noise margin and high integration density of CMOS technology, the fast switching and input/output speed of bipolar technology, and the high voltage characteristics of DMOS technology. As a result, BiCDMOS technology enables power elements, logic elements, etc. to be integrated within a single chip, thereby providing high current driving capability while minimizing the size and power consumption of the chip and increasing the resistance of the chip to high voltages (e.g., electrostatic discharge, supply overvoltage, etc.).

Generally speaking, the techniques typically used to manufacture a BiCDMOS semiconductor element are a combination of the techniques used to manufacture bipolar, CMOS and DMOS elements. However, the manufacture of BiCDMOS semiconductor elements is extremely complicated and requires a large number of mask layers. In particular, manufacturing a BiCDMOS semiconductor element requires the gate electrodes of the CMOS element and the DMOS element to be formed in different processes to achieve stability of the CMOS and DMOS elements. More specifically, after the gate electrode of the DMOS element is formed, ion implantation or channel ion injection for adjusting a threshold voltage of the CMOS element is performed, which is followed by the formation of the gate electrode of the CMOS element. To perform this process, part of the polysilicon layer is left remaining to act as a side wall spacer on a side wall of the gate electrode of the DMOS element while etching a polysilicon layer that forms the gate electrode of the CMOS element.

In semiconductor elements of submicron sizes that require a shallow junction or a diffused region, the side wall spacer present on the side wall of the gate electrode of the DMOS element results in an open (e.g., an open circuit or high impedance region) between the conduction channels that are induced by the source regions and the gate electrode of the DMOS element. This open between the channels results in an undesirable increase in a threshold voltage of the semiconductor element. In turn, such an increase in the threshold voltage prevents the semiconductor element from operating at a gate voltage permitted by the particular semiconductor element.

SUMMARY OF THE INVENTION

In one aspect, a semiconductor element may include a substrate and a first DMOS element formed on a first portion of the substrate. The DMOS element may include a gate electrode having slanted side walls. In addition, the semiconductor element may include a first MOS element formed on a second portion of the substrate that is separate from the first portion.

In another aspect, a semiconductor element may include a substrate and a DMOS element formed in a first region of the substrate. The DMOS element may include a gate electrode having slanted side walls. In addition, the semiconductor element may include a CMOS element formed in a second region of the substrate and a bipolar element formed in a third region of the substrate.

In yet another aspect, a method for manufacturing a semiconductor element may include preparing a substrate that defines a first DMOS element region and a first MOS element region and forming a first gate electrode having slanted side walls on the substrate in the DMOS element region. The method may also include forming a second gate electrode on the substrate in the MOS element region.

The invention itself, together with further objectives and attendant advantages, will best be understood by reference to the following detailed description, taken in conjunction with the accompanying drawings and the appended claims.

DETAILED DESCRIPTION OF THE PREFERRED EMBODIMENTS

Figure 1:
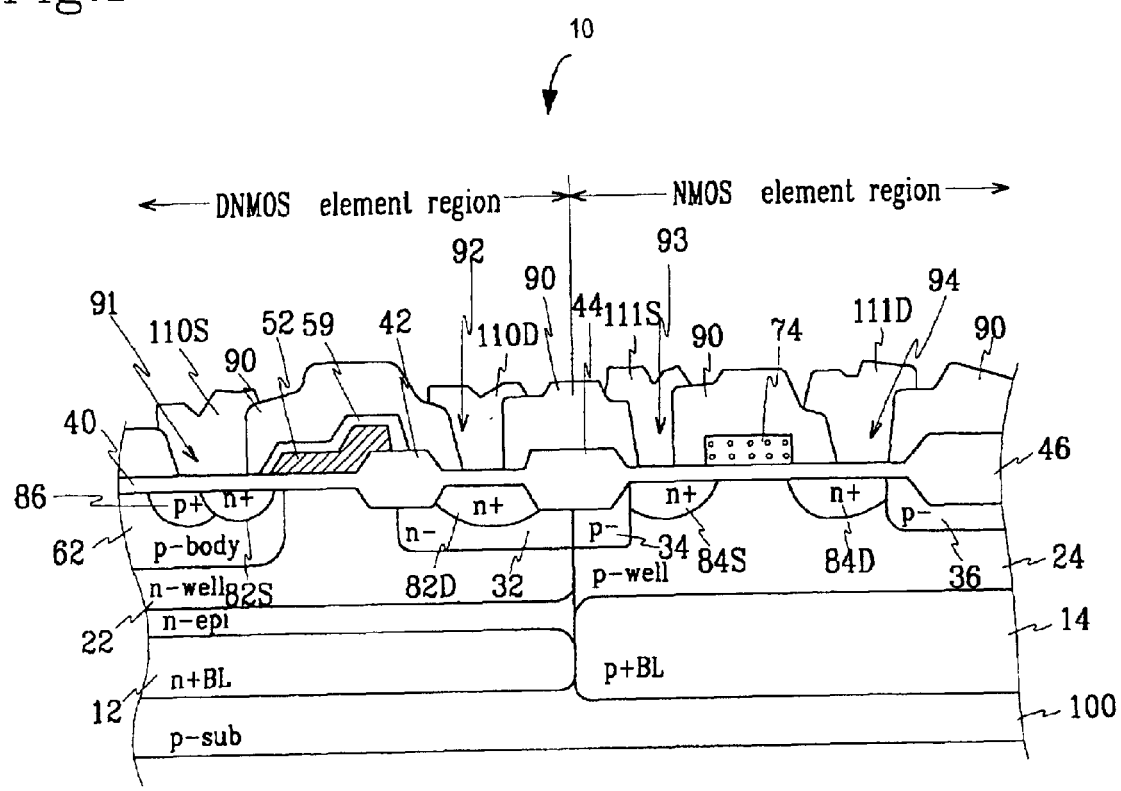
FIG. 1 is an exemplary sectional view of a semiconductor element according to one embodiment of the invention.

FIG. 1 is an exemplary sectional view of a semiconductor element 10 according to one embodiment of the invention. FIG. 1 shows a sectional structure of an n-type DMOS element (hereinafter referred to as a "DNMOS element") and an n-type MOS element (hereinafter referred to as an "NMOS element"). However, it should be recognized that the configuration and/or structure of the semiconductor element 10 shown in FIG. 1 is merely one example of an embodiment of the invention and various other configurations and/or structures, which may include additional and/or different elements, may be used without departing from the scope and the spirit of the invention.

As shown in FIG. 1, a DNMOS element and an NMOS element may be formed on a p-type semiconductor substrate 100 and may be separated into element regions by field oxidation layers 44 and 46. An n-type field region 32 may be formed under the field oxidation layer 44 in the DNMOS element region, and p-type field regions 34 and 36 may be formed under the field oxidation layers 44 and 46 in the NMOS element region. The field regions 32, 34 and 36 are formed under the oxidation layers 44 and 46 and function as channel stoppers or isolators.

In the DNMOS element region, an n-type buried layer 12 having a high ion density (e.g., an ion density of approximately $10^{19}/cm^3$) may be formed on the p-type semiconductor substrate 100, and an n-type well 22 having a low ion density (e.g., an ion density of approximately $10^{16}/cm^3$) may be formed on the n-type buried layer 12. The low density n-type well 22 may be formed by injecting and diffusing ions in an n-type epitaxial layer (n-epi), which may be formed on the high density n-type buried layer 12. If the n-type well 22 is sufficiently large, all of the n-type epitaxial layer may become the n-type well 22 during the formation of the n-type well 22.

A p-type body region 62, which may have an ion density of approximately $10^{17}/cm^3$, may be formed in the n-type well 22. Additionally, an n-type source region 82S having a high ion density (e.g., an ion density of approximately $10^{19}/cm^3$) and a p-type low resistance region 86 having a high ion density (e.g., an ion density of approximately $10^{19}/cm^3$) may be formed in the p-type body region 62. The high ion density of the p-type low resistance region 86 reduces the resistance of the p-type body region 62. Further, an n-type drain region 82D having a high ion density (e.g., an ion density of approximately $10^{19}/cm^3$) may be formed in a portion of the n-type well 22 that opposes the source region 82S as shown in FIG. 1.

A gate oxidation layer 40 may be formed as shown in FIG. 1 to cover all elements exposed after the formation of the elements described above. The gate oxidation layer 40 may be asymmetrical as shown in FIG. 1 and may include a portion or sectional oxidation layer 42 at a predetermined position that is relatively thicker than other portions of the gate oxidation layer 40. The sectional oxidation layer 42 reduces the strength of the electric field that would otherwise concentrated at an edge portion of the drain region 82D, thereby enabling the DNMOS element to withstand relatively high voltages. Of course, the gate oxidation layer 40 may also be formed to have different and/or varying thicknesses that are suitable for the characteristics of a CMOS element and/or a DMOS element.

A gate electrode 52, which is made of polysilicon doped with n-type ions, may be formed over the gate oxidation layer 40 where the sectional oxidation layer 42 and the gate oxidation layer 40 meet. The gate electrode 52 may have slanted side walls so that the side wall portion positioned over the p-type body 62 overlaps at least part of the source region 82S. As a result, when the gate electrode 52 induces a channel during operation of the DNMOS element, the induced channel is connected to the source region 82S so that an open or depletion region is not made between the source region 82S and the channel, as is the case with prior art semiconductor elements.

As shown in FIG. 1, an insulating layer 59 may be formed over the gate electrode 52. Additionally, a protection layer 90 may be formed to cover all elements exposed after the formation of the elements described above. A first contact hole 91 that exposes the source region 82S and the p-type low resistance region 86, and a second contact hole 92 that exposes the drain region 82D, may be formed in the protection layer 90. A source electrode 110S may contact the source region 82S and the p-type low resistance region 86 through the first contact hole 91, and a drain electrode 110D may contact the drain region 82D through the second contact hole 92.

In the NMOS element region, a p-type buried layer 14 having a high ion density (e.g., an ion density of approximately $10^{18}/cm^3$) may be formed on the p-type semiconductor substrate 100, and a p-type well 24 having a low ion density (e.g., an ion density of approximately $10^{16}/cm^3$) may be formed on the p-type buried layer 14. The low density p-type well 24, as with the low density n-type well 22 of the DNMOS element, may be formed by injecting and diffusing p-type ions in an n-type epitaxial layer. If desired, the p-type ions may be fully diffused in the n-type epitaxial layer, as is the case in the drawing. Additionally, an n-type source region 84S and an n-type drain region 84D, both of which may have a high ion density (e.g., an ion density of approximately $10^{19}/cm^3$), may be formed in the p-type well 24.

A gate oxidation layer 40 may be formed to cover all elements exposed after the formation of the elements described above. A gate electrode 74, which may be made of polysilicon doped with n-type ions, may be formed on the gate oxidation layer 40. The gate oxidation layer 40 of the NMOS element region and of the DNMOS element region may be integrally formed, or may be formed separately according to element characteristics. Further, a protection layer 90 may be formed to cover all elements exposed after the formation of the elements described above. Still further, a third contact hole 93 and a fourth contact hole 94, which expose the source region 84S and the drain region 84D, respectively, may be formed in the protection layer 90. A source electrode 111S may contact the source region 84S through the third contact hole 93, and a drain electrode 111D may contact the drain region 84D through the fourth contact hole 94.

In the semiconductor element described herein, because the gate electrode 52 overlaps the source region 82S in the DNMOS element, the source region 82S is connected to the channel induced by the gate electrode 52. As a result, an open or depletion region is not made between the source region 82S and the channel, thereby allowing the operation of the element in response to the application of a predetermined threshold voltage.

Figure 2A:
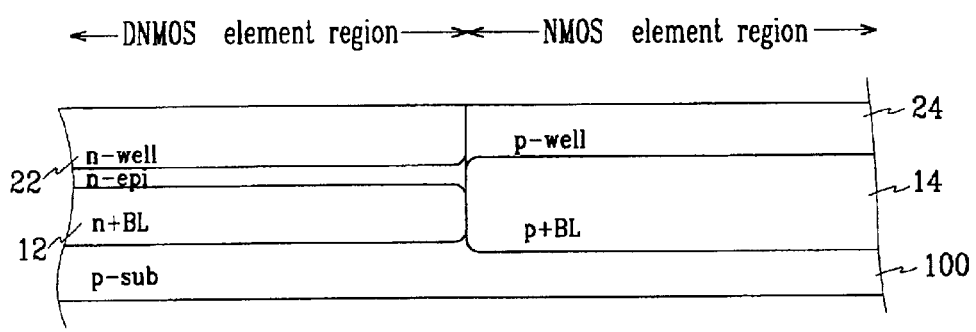
FIGS. 2a–2g are sectional views of the semiconductor element of FIG. 1 as it undergoes sequential processes during manufacture.

FIGS. 2a–2g are sectional views of the semiconductor element 10 of FIG. 1 as it undergoes sequential processes during manufacture. Referring to FIG. 2a, the high density n-type buried layer 12 may be formed on the p-type semiconductor substrate 100 in the DNMOS element region, and the high density p-type buried layer 14 may formed on the p-type semiconductor substrate 100 in the NMOS element region. To perform this process, n-type ions may be selectively implanted or injected into the semiconductor substrate 100 in the DNMOS element region at a density of approximately $10^{19}/cm^3$. Next, p-type ions may be selectively implanted or injected into the semiconductor substrate 100 in the NMOS element region at a density of approximately $10^{18}/cm^3$. Following the injection of n-type and p-type ions, a drive-in diffusion process may be performed to diffuse the injected ions. After completion of the diffusion process, the n-type buried layer 12 may be formed on the p-type semiconductor substrate 100 in the DNMOS element region, and the p-type buried layer 14 may be formed on the semiconductor substrate 100 in the NMOS element region.

After drive in diffusion is complete, the n-type epitaxial layer (n-epi) may be grown on the semiconductor substrate 100 (i.e., on the n-type buried layer 12 and the p-type buried layer 14). Next, n-type ions may be selectively injected into the n-type epitaxial layer of the DNMOS element region at a density of approximately $10^{16}/cm^3$, and then p-type ions may be selectively injected into the epitaxial layer of the NMOS element region at a density of approximately $10^{16}/cm^3$. A drive-in diffusion process may then be performed to diffuse the injected ions. With the completion of the diffusion process, the low density n-type well 22 is formed in the epitaxial layer of the DNMOS element region, and the low density p-type well 24 is formed on the epitaxial layer of the NMOS element region.

The low density n-type well 22 and the low density p-type well 24 may be formed by injecting and diffusing n-type ions and p-type ions, respectively, in the epitaxial layer (n-epi), which is formed on the n-type buried layer 12 and the p-type buried layer 14. Because the diffusion of p-type ions is faster than that of n-type ions, the n-type epitaxial layer (n-epi) contacts the n-type buried layer 12 and the n-type well 22 contacts the n-type epitaxial layer (n-epi) in the DNMOS element region, while the p-type well 24 contacts the p-type buried layer 14 in the NMOS element region as shown in FIG. 2a.

In the DNMOS element region, the n-type well 22 contacts the n-type epitaxial layer (n-epi) provided on the n-type buried layer 12, and in the NMOS element region, the p-type well 24 contacts the p-type buried layer 14. As shown in FIG. 2a, the p-type buried layer 14 may be diffused to a greater extent toward the p-type well 24.

Figure 2B:
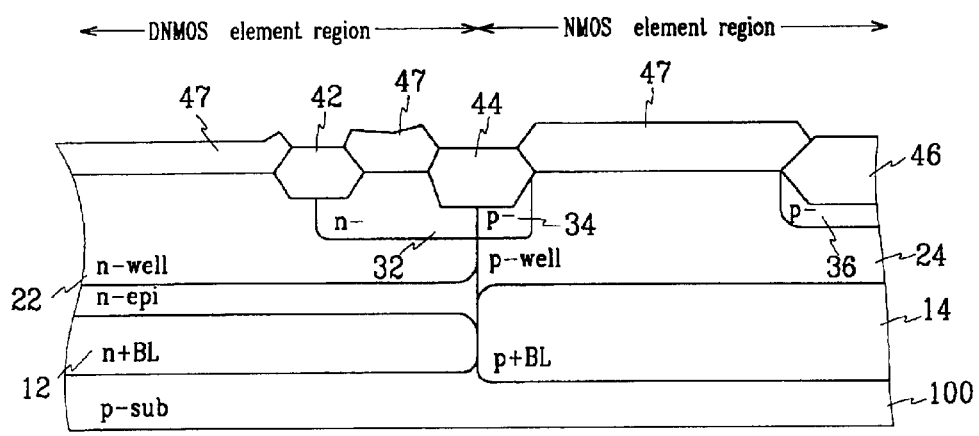

Referring to FIG. 2b, the field oxidation layers 44 and 46 that separate the NMOS element region from the DNMOS element region, and the sectional oxidation layer 42 positioned in the DNMOS element region may be formed using a conventional localized oxidation of silicon (LOCOS) process. To realize the above, after thin pad oxidation layers (not shown) are formed at predetermined areas, a nitride layer pattern 47 may be formed over all regions except where the field oxidation layers 44 and 46 and the sectional oxidation layer 42 will be formed. The nitride layer pattern 47 limits an activation region of each element in preparation for the formation of the field oxidation layers 44 and 46 that separate each activation region.

Subsequently, n-type field ions may be selectively injected into the n-type well 22 to form the n-type field region 32, and p-type field ions may be selectively injected into the p-type well 24 to form the p-type field regions 34 and 36. Next, an oxidation process may be performed to grow an oxidation layer having a substantial thickness on areas of the substrate where the nitride layer pattern 47 is not located, thereby forming the field oxidation layers 44 and 46 and the sectional oxidation layer 42. While the field oxidation layers 44 and 46 and the sectional oxidation layer 42 are being grown, n-type field ions and p-type field ions may be diffused so that the n-type field region 32 and the p-type field regions 34 and 36 are formed under the field oxidation layers 44 and 46.

Figure 2C:
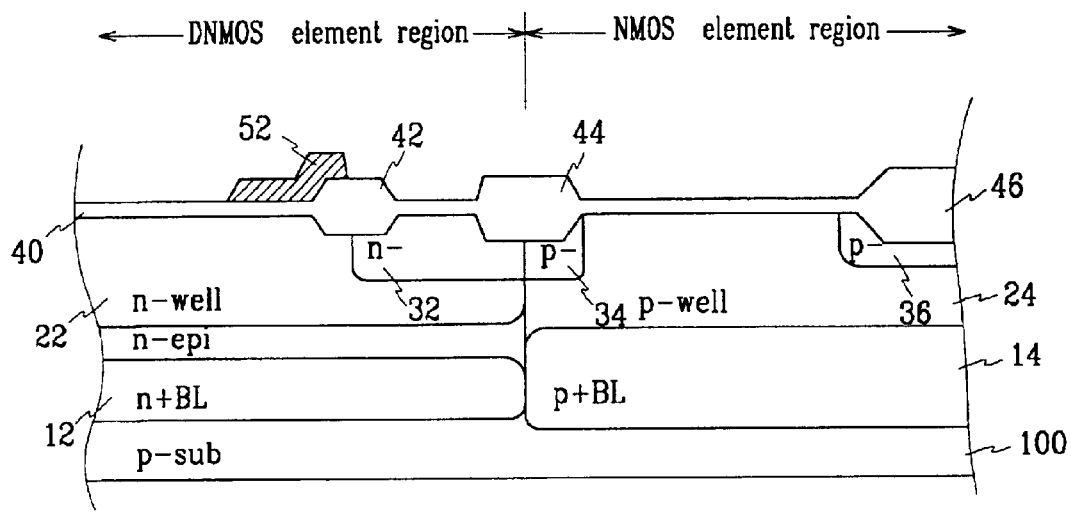

Following the above, with reference to FIG. 2c, the nitride layer pattern 47 and the thin pad oxidation layers (not shown) formed under the nitride layer pattern 47 may be removed. Next, an oxidation layer may be grown over all exposed elements to form the gate oxidation layer 40, which includes the sectional oxidation layer 42. As a result of the formation of the sectional oxidation layer 42, the gate oxidation layer 40 is asymmetrical in the DNMOS element region.

Next, after a first polysilicon layer is deposited over the entire exposed surface of the gate oxidation layer 40, doping of n-type ions at a high density may be performed to reduce the resistance of the first polysilicon layer. The first polysilicon layer may then be dry etched using a photolithography process to form the gate electrode 52 of the DNMOS element. During the dry etching process, the side walls of the gate electrode 52 of the DNMOS element may be patterned to have a positive-type slant. This may be performed using conventional methods such as by varying etching conditions for etching the first polysilicon layer. For example, a composition ratio of an etching gas for etching the polysilicon layer may be varied, the etching time may be changed, etc.

Figure 2D:
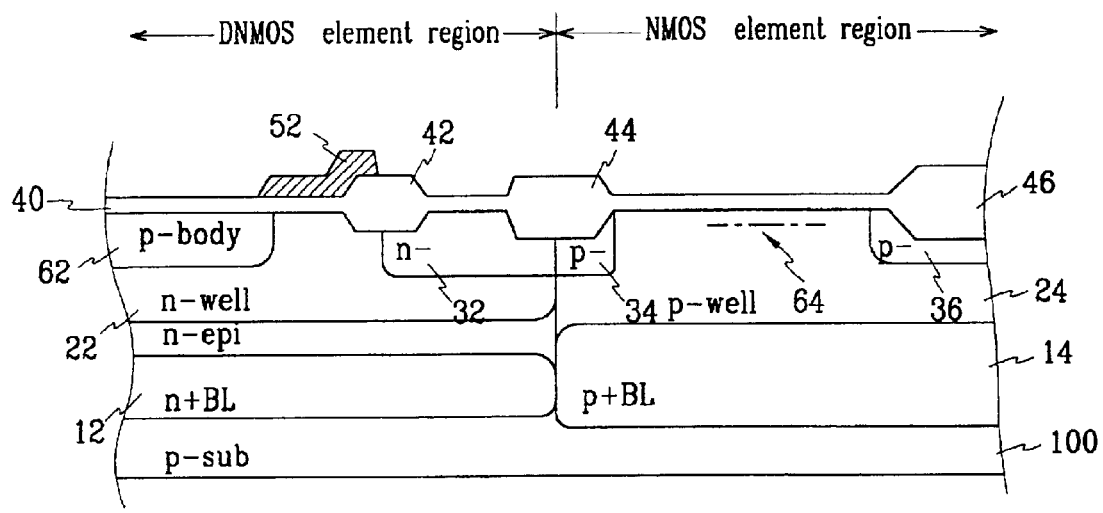

Next, with reference to FIG. 2d, p-type ions may be selectively injected at a high density of approximately $10^{17}/cm^3$ where the p-type body region 62 will be formed in the n-type well 22, after which a drive-in diffusion process may be performed to diffuse the p-type ions and form the p-type body region 62. Following the formation of the p-type body region 62, n-type channel ions 64 may be injected into the p-type well 24 of the NMOS element region to adjust a threshold voltage of the NMOS element. At this time, the amount and depth of injection of the channel ions 64 may be varied to achieve a predetermined threshold voltage.

Figure 2E:
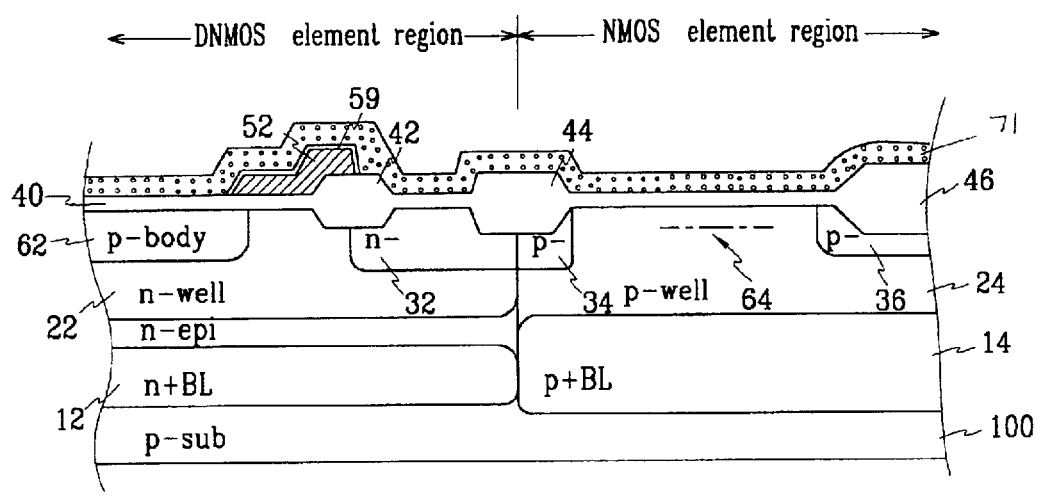

Subsequently, with reference to FIG. 2e, a surface of the gate electrode 52 of the DNMOS element may be oxidized to form the insulating layer 59. Next, a second polysilicon layer 71 for forming the gate electrode 74 of the NMOS element may be deposited over all exposed elements, after which doping of n-type ions at a high density may be performed to reduce a resistance of the second polysilicon layer 71.

Figure 2F:
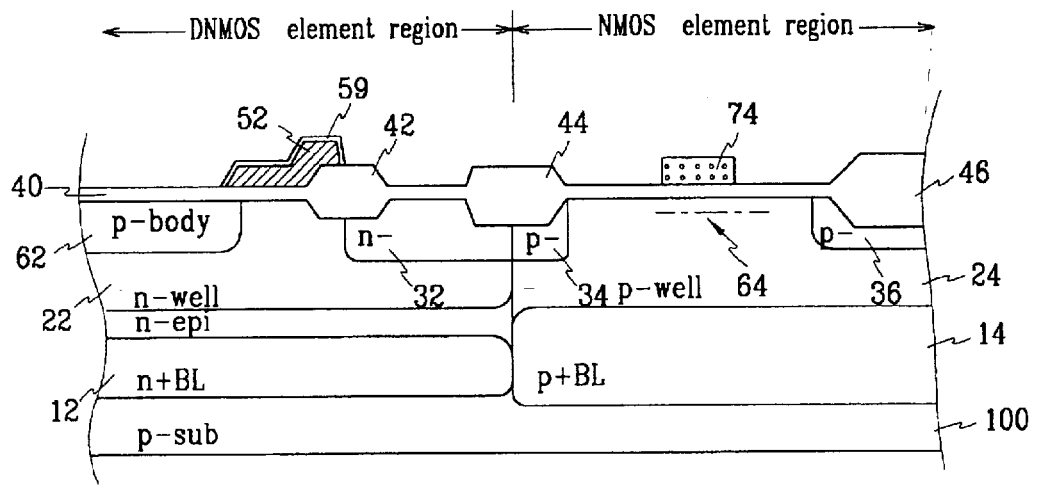

After the above, with reference to FIG. 2f, the second polysilicon layer 71 may be dry etched using a photolithography process to form the gate electrode 74 of the NMOS element. Because the side walls of the gate electrode 52 of the DNMOS element are in a positive-type slant, the second polysilicon layer 71 is not left remaining on (i.e., is completely removed from) the side walls of the gate electrode 52 of the DNMOS element. In other words, because the side walls of the gate electrode 52 of the DNMOS electrode are formed to have a positive-type slant, the second polysilicon layer 71 deposited on the gate electrode 52 has a uniform thickness over its entire surface. If the second polysilicon layer 71 formed in this manner is dry etched, none of the second polysilicon layer 71 is left remaining on the side walls of the gate electrode 52 of the DNMOS element because all areas are etched to a uniform thickness.

Figure 2G:
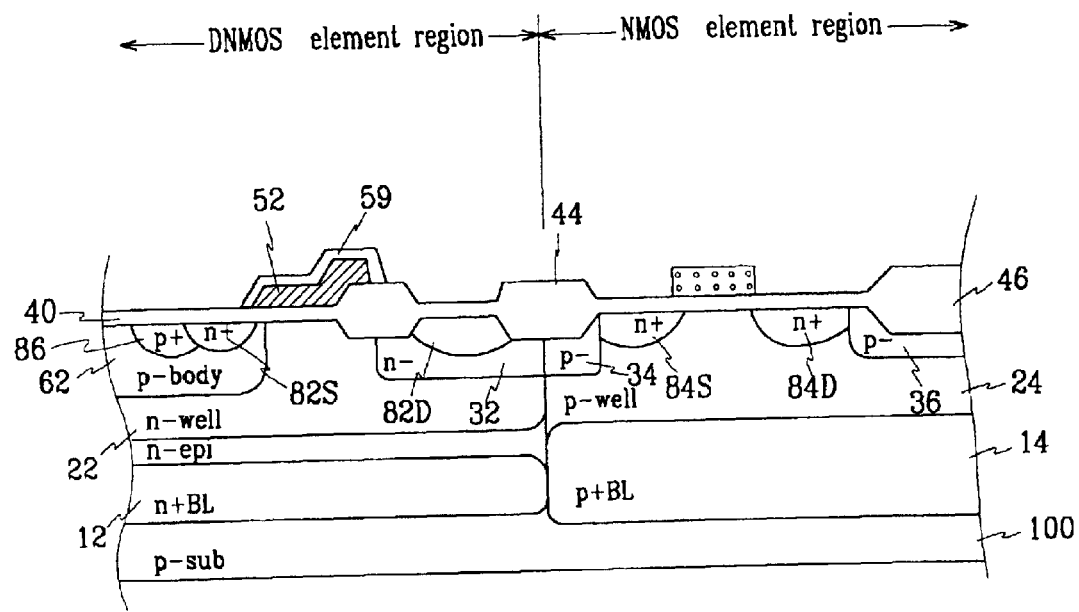

Subsequently, with reference to FIG. 2g, n-type ions may be selectively injected into areas where the source region 82S and the drain region 82D of the DNMOS element will be formed and may also be injected where the source region 84S and the drain region 84D of the NMOS element will be formed. At this time, the side walls of the gate electrode 52 of the DNMOS element provide a self-aligned ion injection mask, which is used when the ions are injected into the area where the source region 82S will be formed. Accordingly, in a subsequent process, overlapping occurs between the source region 82S, which is formed by performing a drive-in diffusion process, and the gate electrode 52. Further, the gate electrode 74 of the NMOS element also becomes a self-aligned ion injection mask used during the injection of ions in the areas where the source region 84S and the drain region 84D will be formed.

Next, p-type ions may be selectively injected at a density of approximately $10^{16}/cm^3$ in the area where the p-type low resistance region 86 will be formed. Following the above, a drive-in diffusion process may be performed so that the injected n-type ions and p-type ions are diffused, thereby forming the source region 82S and the drain region 82D of the DNMOS element and the source region 84S and the drain region 84D of the NMOS element. The p-type low resistance region 86 of the DNMOS element may also be formed in the p-type body 62.

Subsequently, referring back to FIG. 1, the protection layer 90 may be formed. In particular, a high temperature oxide (HTO) layer may be formed over all elements exposed after the processes performed above. The HTO layer may be dry etched using a photolithography process to form the first contact hole 91 that exposes the source region 82S and the p-type low resistance region 86 of the DNMOS element, the second contact hole 92 that exposes the drain region 82D of the DNMOS element, the third contact hole 93 that exposes the source region 84S of the NMOS element and the fourth contact hole 94 that exposes the drain region 84D of the NMOS element.

Next, a conductive layer may be deposited over the entire surface of the substrate. In other words, all elements exposed after the above process may be covered with a conductive material. The conductive layer may be etched using a photolithography process to form the source electrode 110S of the DNMOS element that contacts the source region 82S and the p-type body 86 of the DNMOS element via the first contact hole 91, and to form the source electrode 111S and the drain electrode 111D of the NMOS element that contacts, respectively, the source region 84S and the drain region 84D of the NMOS element through the third contact hole 93 and the fourth contact hole 94, respectively. Because the side walls of the gate electrode of the DMOS element form a positive-type slant, the conductive layer to form the gate electrode of the CMOS element is not left remaining on the side walls of the gate electrode.

Importantly, the semiconductor element structures and manufacturing methods thereof described herein result in a semiconductor structure in which an open or depletion region is not formed between the source region in the DMOS element and a channel. As a result, it is not necessary to increase a threshold voltage, and operation of the semiconductor element is possible with a gate voltage permitted by the element.

Although only the structures of the DNMOS element and the NMOS element formed on the substrate have been described herein, it should be realized that this is merely one exemplary implementation and that the other types of structures such as, for example, a p-type DMOS element and a p-type MOS element may be used in addition to or instead of those described herein without departing from the scope of the invention. Further, the invention disclosed herein may be generally applied to all types of semiconductor elements, particularly those semiconductor elements having a DMOS element and a CMOS element formed together on a substrate. For example, the invention disclosed herein may be applied to a BiCDMOS element, in which a DMOS element, a CMOS element and a bipolar element are formed on a single substrate.

A range of characteristics and modifications can be made to the preferred embodiment described above. The foregoing detailed description should regarded as illustrative rather than limiting and the following claims, including all equivalents, are intended to define the scope of the invention.

What is claimed is:

1. A semiconductor element comprising:

a substrate;

a first DMOS element formed on a first portion of the substrate, wherein the DMOS element includes:

a source region;

a drain region;

a gate electrode having slanted side walls, a portion of one of the slanted side walls overlapping a part of the source region and another one of the slanted side walls not overlapping the drain region; and a first MOS element formed on a second portion of the substrate that is separate from the first portion, wherein the first MOS element includes a gate electrode having side walls with a different profile than the slanted side walls of the first DMOS element.

2. The semiconductor element of claim 1, wherein the first DMOS element includes:

a well of a first conductive type formed on the substrate;

a body region of a second conductive type formed in the well;

a gate insulating layer formed between the well and the gate electrode;

wherein the source region comprises the first conductive type formed in the body region; and wherein the drain region comprises the first conductive type formed in the well and spaced from the source region.

3. The semiconductor element of claim 1, wherein the first MOS element includes:

a well of a first conductive type farmed on the substrate;

a source region of a second conductive type formed in the well;

a drain region of the second conductive type formed in the well;

a gate electrode formed on the well of the first conductive type; and a gate insulating layer interposed between the gate electrode and the well of the first conductive type.

4. The semiconductor element of claim 3, further comprising:

a protection layer covering the first MOS element and the first DMOS clement, wherein the protection layer has first and second contact holes that expose the source region of the first DMOS element and the drain region of the first DMOS element, and wherein the protection layer has third and fourth contact holes formed in the protection layer to expose the source region of the first MOS element and the drain region of the first MOS element;

a source electrode that contacts the source region of the first DMOS clement through one of the first and second contract holes;

a drain electrode that contacts the drain region of the first DMOS element through the other one of the first and second contact holes;

a source electrode that contacts the source region of the first MOS clement through one of the third and fourth contact holes; and a drain electrode that contacts the drain region of the first MOS element through the other one of the third and fourth contact holes.

5. The semiconductor element of claim 1, wherein a gate insulating layer of the first DMOS element includes a relatively thicker portion.

6. The semiconductor element of claim 1, further comprising:

a second DMOS element formed on the substrate opposing the first DMOS element; and a second MOS element formed on the substrate opposing the first MOS element.

7. The semiconductor element of claim 6, wherein the second DMOS element includes a gate electrode having slanted side walls.

* * * * *